United States Patent [19]

Melcher

[11] Patent Number: 5,434,773

[45] Date of Patent: Jul. 18, 1995

[54] METHOD AND FACILITY FOR THE IDENTIFICATION OF DYNAMIC CHARACTERISTIC QUANTITIES

[75] Inventor: Jörg Melcher, Rosdorf, Germany

[73] Assignee: Deutsche Forschungsanstalt Fur Luft - Und Raumfahrt E.V., Cologne, Germany

[21] Appl. No.: 9,776

[22] Filed: Jan. 28, 1993

[30] Foreign Application Priority Data

Jan. 30, 1992 [DE] Germany .......................... 42 02 578.8

[51] Int. Cl.⁶ ............................................. G11C 11/00
[52] U.S. Cl. .................................. 364/15 D; 364/151
[58] Field of Search ................................ 364/148-159, 364/495, 551.01-555

[56] References Cited

U.S. PATENT DOCUMENTS

| | | | |
|---|---|---|---|
| 4,607,326 | 8/1986 | Mori et al. ........................... | 364/162 |
| 4,639,853 | 1/1987 | Rake et al. ............................ | 364/149 |
| 4,679,136 | 7/1987 | Shigemasa ............................ | 364/150 |
| 4,725,942 | 2/1988 | Osuka .................................... | 364/150 |
| 4,814,968 | 3/1989 | Fukumoto ............................ | 364/150 |
| 4,949,236 | 8/1990 | Yeh et al. .............................. | 364/148 |
| 4,970,638 | 11/1990 | Yeh et al. .............................. | 364/150 |
| 5,034,312 | 7/1991 | Saito ..................................... | 364/149 |
| 5,060,132 | 10/1991 | Beller et al. .......................... | 364/150 |

OTHER PUBLICATIONS

J. Melcher, Synthesis of Optimized Adaptive Digital Filters for System Identification and Vibration Control, Jun. 1991.

V. Fullekruvg, Suervey of Parameter Estimation Methods in Experimental Modal Analysis, Jour. of Soc. of Envir. Engrs. Mar. 1988.

Primary Examiner—James P. Trammell
Attorney, Agent, or Firm—Hopkins & Thomas

[57] ABSTRACT

A method for identification of dynamic characteristic quantities in a linear system having an electronic model, the electronic model having a complex signal flow with a complex residual $a_i = a'_i + ja''_i$, and a complex inherent value $b_i = b'_i + jb''_i$ of the 'i'th degree freedom describing model parameters $a'_i, a''_i, b'_i$, and $b''_i$ for each degree of the system. The various signal flows are arranged parallel to one another for the various degrees of freedom, and are excited by the same signal 'f' as the linear system. A difference e(n) determined at the time 'n' between a model response 'y' and a similar system response 'd', the system response having been time delayed by one unit of time, is used for adapting the model parameters for the system for the point in time (n+1), using variable step sized coefficients $a'_i(n), a''_i(n), \beta'_i(n), \& \beta''_i(n)$ for determining the accuracy of the adaptation to the system.

8 Claims, 8 Drawing Sheets

METHOD AND FACILITY FOR THE IDENTIFICATION OF DYNAMIC CHARACTERISTIC QUANTITIES

FIELD OF THE INVENTION

The invention refers to a method for the identification of dynamic characteristic quantities in a linear dynamic system and a corresponding facility. The system to be identified may be an acoustic, electronic, optical or mechanical system.

BACKGROUND OF THE INVENTION

A method of the aforementioned type is known from the article "SYNTHESIS OF OPTIMIZED ADAPTIVE DIGITAL FILTERS FOR SYSTEM IDENTIFICATION AND VIBRATION CONTROL" (J. Melcher, International Forum on Aeroelasticity and Structural Dynamics 1991, Eurogress Center Aachen, FRG). To identify the dynamic system, not only the system itself but also an electronic model of the system is excited using the signal 'f'. The difference 'e' between the system response and the model response is a measure of the matching of the system and the model. When adapting the model parameters to the system, the difference 'e' is reduced to zero or is at least minimized. The above article is concerned exclusively with a method for the identification of a dynamic system with a single degree of freedom, whereby an acceleration is received as the system response. For this, the electronic model is given, besides signal flow 'I', an auxiliary signal flow with a parameter which is to be adapted further. Among the given conditions it is explained that the method described for on-line identification of the single degree of freedom for the system under observation is reliably suitable. In this context, the electronic model is designated as a digital filter. The fact that real dynamic systems almost always exhibit several degrees of freedom is regarded as a major disadvantage of the known system. The above article does not provide any help for their identification.

With another known method for the identification of dynamic characteristic quantities in a linear dynamic system, linear differential equations are used as a model for the system. This is encumbered with the major disadvantage that the method cannot be performed on-line. The time required for evaluating the system response is usually so long that, for example, a systematic and controlled influencing of the dynamic characteristic quantities through modifications to the system is not possible. After every modification to the system, dam must be recorded which then has to be evaluated in a separate step before the effects of the modification are defined. On the other hand, these known methods have the advantage that they are also suitable for the identification of dynamic systems with several degrees of freedom. However, the amount of work necessary to execute the method increases superproportional to the number of degrees of freedom due to their cross-linking.

SUMMARY OF THE INVENTION

Therefore, it is the object of the invention to indicate a method of the aforementioned type which satisfies the real time requirements and, in addition, is suitable for the identification of dynamic systems with several degrees of freedom.

It has come to light that, with a known method, it is sufficient to provide a large number of signal flows 'I' in order to cover a large number of degrees of freedom in a dynamic system. In this case, each of the individual signal flows 'I' correspond to the signal flow 'I' of the known method for considering one degree of freedom.

In particular, the individual signal flows 'I', do not cross-link with each other, but are arranged parallel to and independent from each other. when using the embodiments II to V for adapting the model parameters $a'_i$, $a''_i$, $b'_i$ and $b''_i$, there results, with each signal flow, a characteristic model parameter for one degree of freedom of a dynamic system. In doing this, the model parameters $b'_i$ and $b''_i$, the corresponding characteristic frequency $f_i$, and the associated damping quantity according to Lehr $\delta_i$ can be determined from the real part and the imaginary part of the inherent value $b_i$:

$$f_i = \frac{1}{2\pi\tau} \sqrt{\frac{1}{4} \ln^2(b'^2_i + b''^2_i) + \arctan^2\left(\frac{b''_i}{b'_i}\right)}$$

$$\delta_i = -\frac{\ln(b'^2_i + b''^2_i)}{2\sqrt{\frac{1}{4} \ln^2(b'^2_i + b''^2_i) + \arctan^2\left(\frac{b''_i}{b_i}\right)}}$$

It is noticeable upon carrying out the new method that despite the system being underdefined because no signal flow is allocated to a certain degree of freedom at the very beginning, a stable condition is reached after only a few adaptive steps. The absolute number of steps here depends on the choice of the step size coefficients $\alpha'_i$, $\alpha''_i$, $\beta'_i$ and $B''_i$, which, on the other hand, determine the accuracy of the adaptation. An identification becoming correct according to real-time requirements, also in systems with several degrees of freedom, can, however, always be realized without any problems.

A further interesting phenomenon when carrying out the new method results if the number of parallel signal flows exceeds the maximum number of degrees of freedom of the system. Again in this ease, this does not lead to any instabilities, rather some of the degrees of freedom divide themselves up between several signal flows, whereby each signal flow can be permanently allocated to a certain degree of freedom. This can be advantageously exploited with the identification of a dynamic system having an unknown number of degrees of freedom. If, namely, too many signal flows are deliberately provided, then every degree of freedom that appears may be reliably acquired.

As with the known method for the identification of dynamic systems with one degree of freedom, it is also necessary with the new method to provide a parallel auxiliary signal flow in the model if an acceleration is received as a system response. The auxiliary signal flow is, however, superfluous with velocities or paths as a system response. The construction and adaptation of the auxiliary signal flow includes the multiplication of the input signal by a factor c(n) delayed by one unit of time, resulting in an output signal. In the single degree of freedom model known from the state of the art, parameter 'c' contains information about the mode of oscillation and the kinetic energy in the one degree of freedom with the new method, however, only one auxiliary signal flow is to be provided for all degrees of freedom. Otherwise, no clear and stable adaptation of the model to the system is possible.

With the practical execution of the new method, the signal 'f', can be fed to the system via an actuator which, for example, may be constructed as a shaker, while the system response is received by a sensor. This version is matched to the identification of the mechanical system.

The new method can be advantageously employed for the early detection of failures in dynamic systems, whereby alterations to the dynamic characteristic quantities are detected. The occurrence of the failure reveals itself at an early stage, in particular with mechanical systems, by a change in the dynamic characteristic quantities of the system. It is by exploiting this fact that the new method is well suited for early detection of failures. This even applies if it is an oscillating dynamic system such as an aircraft. In this case, the system is to be excited with signal 'f' as well as with the oscillations present all the time. By using a correlation analysis it can be checked whether it is a sequence of the permanent oscillations or a real system response to signal 'f', with a change in the monitored measured variable. The additional excitation of the dynamic system can also be performed transiently in order to avoid long-term loadings through signal 'f'.

In order to address all the degrees of freedom of a dynamic system, the use of white noise for signal 'f' has proved to be advantageous. However, it is possible, for example, to employ pulse or chirp signals as well as colored noise. The important thing to remember is that the system is excited in all degrees of freedom.

A facility for executing the above described method for the identification of dynamic characteristic quantities has a signal transmitter, an actuator for exciting the system, a sensor to receive the system response, an electronic filter serving as a model for the system and adaptive electronics for adapting the filter to the system. The facility has a signal transmitter, an actuator for exciting the system, a sensor for receiving a system response 'd', an electronic filter which serves as a model for the system, and an adaptive electronic for adapting the filter to the system, wherein the electronic has a degree of freedom 'i' less than or equal to the total 'm' of the degrees of freedom of the system. The facility also has a difference transmitter, and a time delay device, so that a difference 'e' is determined by the difference transmitter between the model response 'y' of the filter, and the system's response 'd' delayed by one unit of time by the time delay device. Variable factors or step coefficients $\alpha'_i(n), \alpha''_i(n), \beta'_i(n), \& \beta''_i(n)$ are also provided as a part of the apparatus for determining the accuracy of the filter's adaptation to the system. For this facility, the circuit of the electronic filter and the adaptive electronics may be built digitally as described hereinabove. However, the use of a corresponding analog circuit is also possible.

Besides the pure identification of dynamic systems, the new method can be used, for example, for the on-line optimization of such linear systems in which the optimum operating point must be determined. Further opportunities for application are the removal of disturbance signals and the checking of particularly fast regulators.

BRIEF DESCRIPTION OF THE DRAWINGS

The invention is explained in more detail and is more closely described in the following by means of embodiment examples.

DETAILED DESCRIPTION

Figure 1:
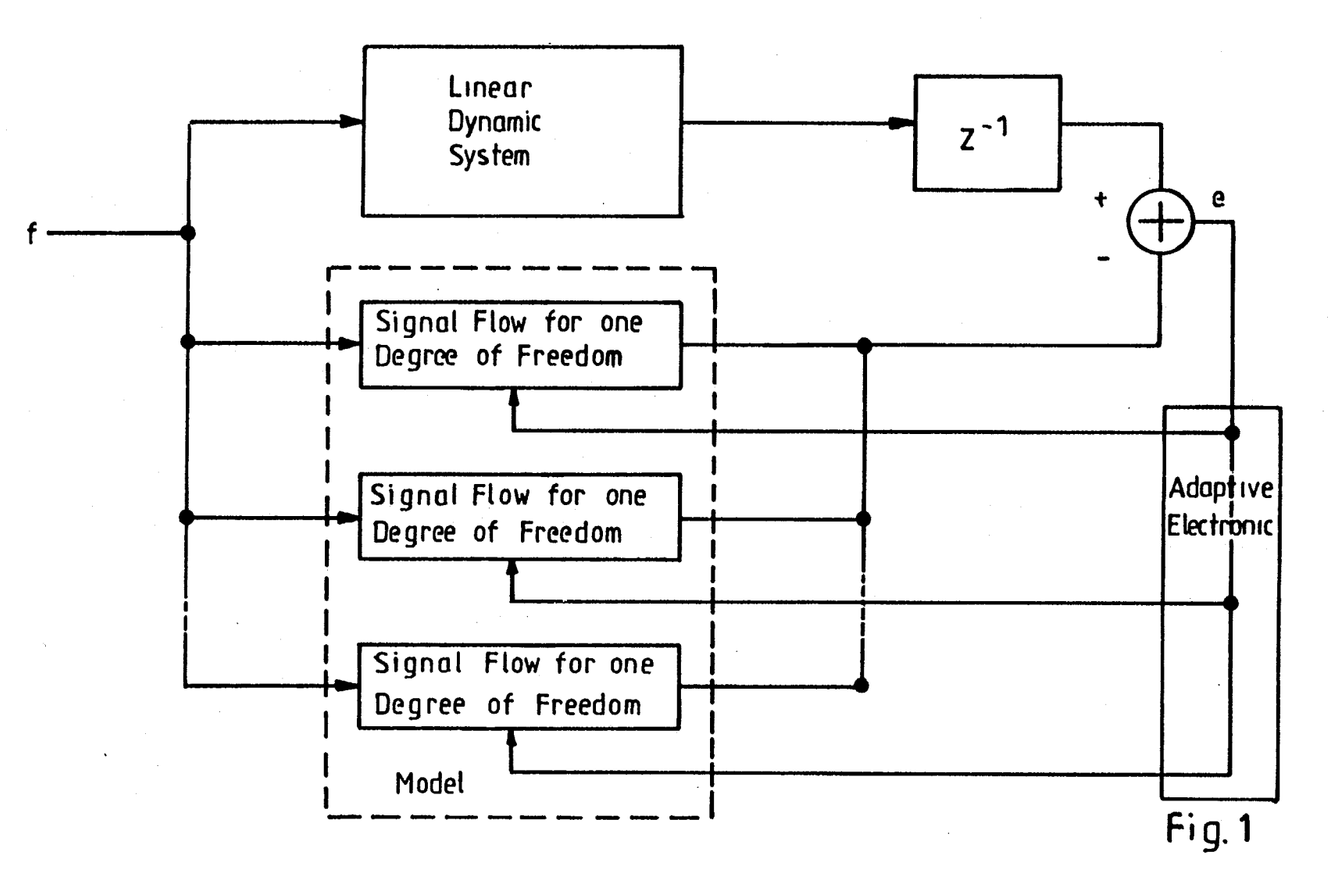
FIG. 1 shows a block diagram for executing the method.

According to the block diagram illustrated in FIG. 1, the system 1 and a model 2 are both excited by the same signal 'f' upon the identification of dynamic characteristic quantities of a linear dynamic system 1. Following this, a model response 'y' is compared to a similar, i.e. equal-phase system response 'd'. The difference 'e' between the system response 'd' and the model response 'y' serves as an error signal for adapting the model, or rather the model parameters. Before the system response 'd' can be compared to the model response 'y' the system response 'd' must undergo a delay in a time delay device 3. This bases on the construction of the model 2. The circuit of model 2 has a signal transmitter 4, an actuator 5 for exciting system 1, and a sensor 6 for receiving a system response 'd'. The circuit of model 2 also has an electronic filter 11, wherein the filter serves as a model 2 for system 1, and an adaptive electronic 7 for adapting filter 11 to system 1, wherein adaptive electronic 7 has a degree of freedom 'i' less than or equal to the total 'm' of the degrees of freedom of system 1. The circuit also has a difference transmitter 12, and a time delay device 3, whereby the difference transmitter determines a difference 'e' between model response 'y' of the filter and a time delayed response 'd' delayed by one unit of time by the time delayed device 3. The accuracy of the adaptation of filter 11 to System 1 is determined by variable step coefficients $\alpha'_i(n), \alpha''_i(n), \beta'_i(n), \& \beta''_i(n)$. At least one signal flow I is provided for every degree of freedom of system 1. Furthermore, model 2 has an auxiliary signal flow VI which results from the multiplication of the input signal by a factor or parameter 'c' delayed by one unit of time, resulting in the output signal. The parameter 'c' is determined by delaying the exciting signal 'f' by one unit of time, and by multiplying the delayed input signal by a factor $\gamma_i(n)$ and by the difference 'e', and then adding the value of 'c' thereto, resulting in a factor c(n+1). Using auxiliary signal flow VI, the model is suitable for carrying out the new method if accelerations are measured in system I as a system response to signal 'f'. The adaptation of the model 2 with the aid of difference 'e' is carried out through the facility described above, and through the method as described below.

FIGS. 4 through 8 illustrate circuit diagrams for both model 2 and adaptive electronic 7 used to adapt model response 'y' to system 1.

Figure 4:
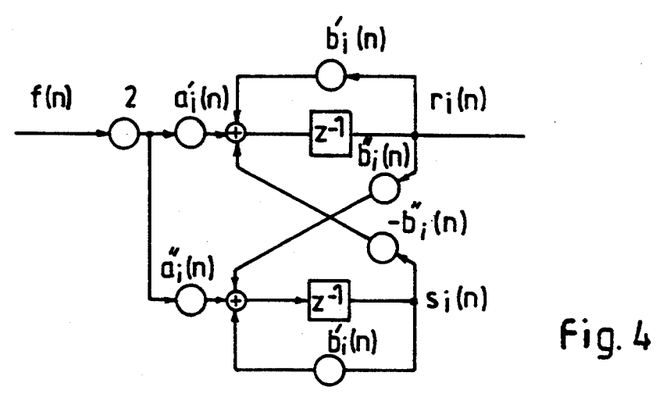
FIG. 4 shows a circuit diagram for the generation of a signal flow $r_i(n)$

Turning first to FIG. 4, a circuit diagram is shown for the generation of a signal flow $r_i(n)$. In more detail, this circuit starts with the signal 'f', then duplicating the signal, and splitting the duplicated signal into a first and second part signal. Thereafter, the first part signal is multiplied by a factor $a'_i(n)$, and the second part signal is multiplied by a factor $a''_i(n)$. A first intermediate signal and a second intermediate signal are then added to the first part signal and a third intermediate signal and a fourth intermediate signal is added to the second part signal, respectively. The resulting sum of the first and second part signals are then each delayed by one unit of time. The sum of the first part signal and the first intermediate signal and second intermediate signal is transmitted as an output signal $r_i(n)$. Output signal $r_i(n)$ is then multiplied by a factor $b'_i(n)$ and added to the first part signal as the first intermediate signal. At the same time, output signal $r_i(n)$ is multiplied by a factor $b''_i(n)$ and added to the second part signal as a third intermediate signal. Still referring to FIG. 4, the now delayed sum of the second part signal is transmitted as an output signal $s_i(n)$. $S_i(n)$ is multiplied by a factor $b_i(n)$ and added to the second part signal as the fourth intermediate signal. Simultaneously, $s_i(n)$ is multiplied by a factor $-b''_i(n)$ and added to the first part signal as a second intermediate signal.

Figure 9:
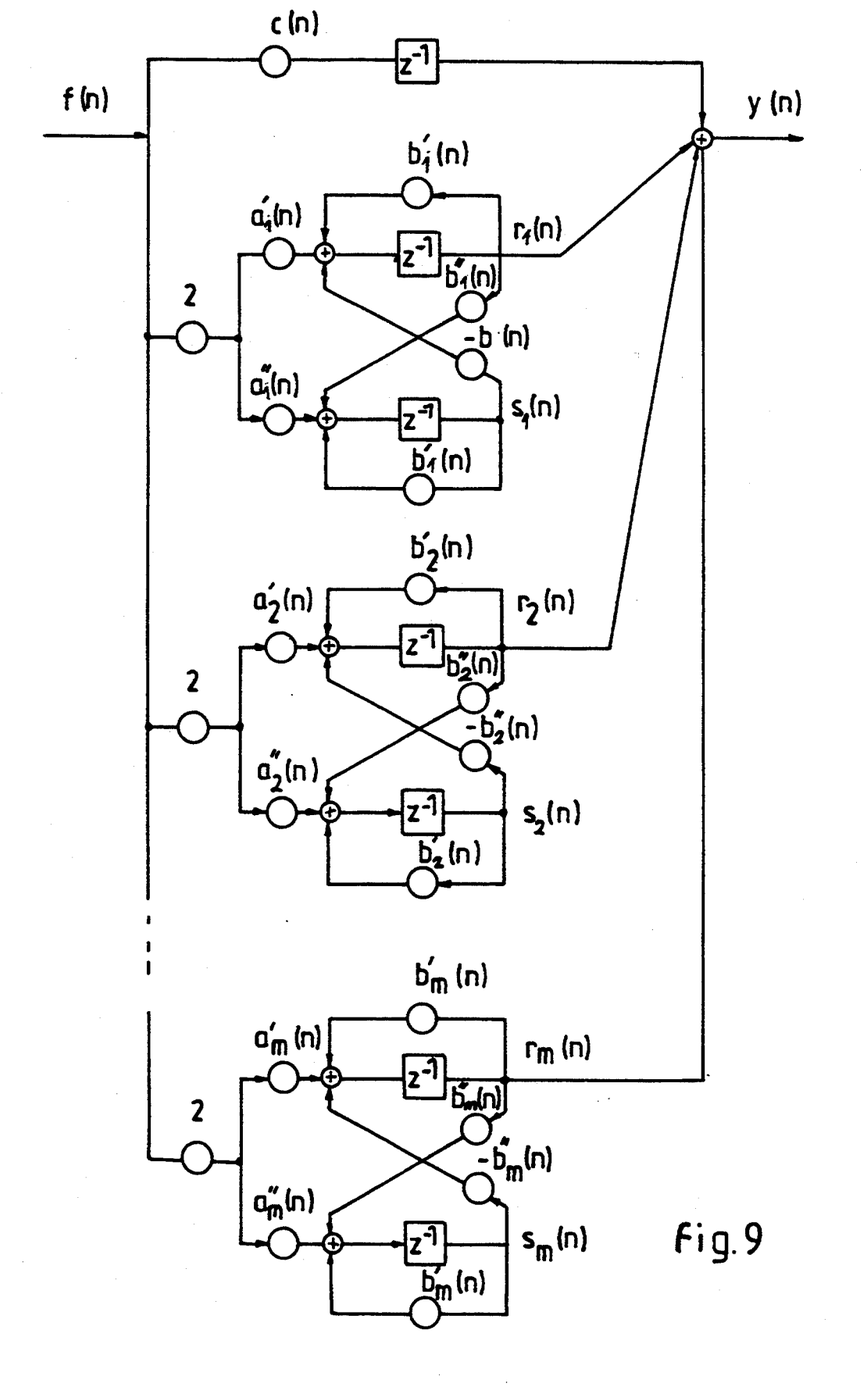
FIG. 9 shows a circuit diagram for the generation of model response y(n)

Referring now to FIG. 9, the signal flows for each degree of freedom 'i' are arranged parallel to one another, and the output signals $r_i(n)$ of each individual signal flow are superimposed to form a model response $y'(n)$. Model parameters $a'_i, a''_i, b'_i$, and $b''_i$, complex residual $a_i = a'_i + ja''_i$, and complex inherent value $b_i = b'_i + jb''_i$ of each degree of freedom are approximated at the beginning of the process.

After the output signals of each degree of freedom 'i', are superimposed to form a model response 'y'(n), a difference (e) is determined at a point in time 'n' between the model response y(n) and a similar system response 'd', the system response having been time delayed by one unit of time. The difference (e) is used to adapt the model parameters to system I for the point in time (n+1). Each of the model parameters has a variable step sized coefficient $\alpha'_i(n), \alpha''_i(n), \beta'_i(n), \& \beta''_i(n)$, respectively, for determining the accuracy of the adaptation of the model response y(n) to system 1.

Figure 5:
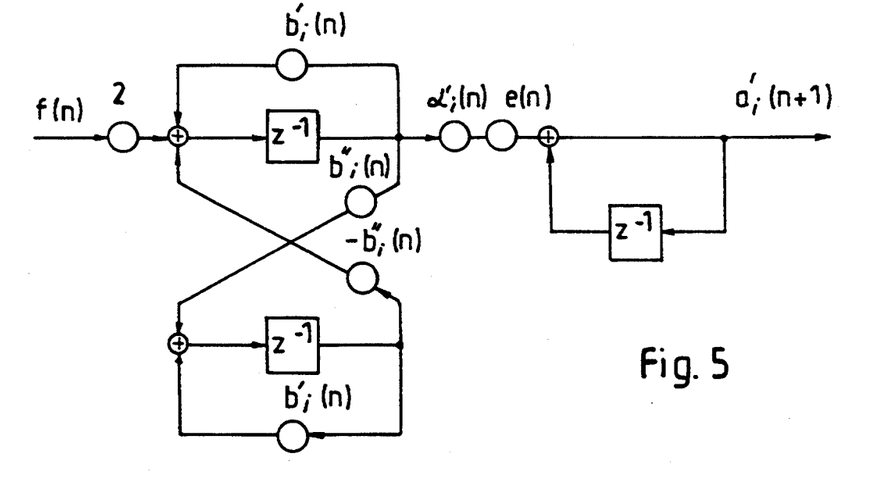
FIG. 5 shows a first adapting circuit diagram

FIG. 5 illustrates the first of the four adapting circuits. The following steps occur in the circuit illustrated in FIG. 5. The exciting signal (f) is duplicated, and two intermediate signals are added to the duplicated input signal, resulting in a first part signal. A second part signal results from the addition of two further intermediate signals, whereupon both the first and second part signals are delayed by one unit of time. The delayed first part signal will be processed further, and is also used for the formation of two intermediate signals. The delayed first part signal is multiplied by a factor $b'_i(n)$, and then added as a first intermediate signal to the duplicated input signal. The delayed first part signal is also multiplied by a factor $b''_i(n)$, and then used as a third intermediate signal added to the second part signal. The delayed second part signal is used exclusively for the formation of the other two intermediate signals. The delayed second part signal is multiplied by a factor $b'_i(n)$, and then used as a fourth intermediate signal added to the second pan signal. The delayed second part signal is also multiplied by a factor $-b''_i(n)$ and then added as a second intermediate signal to the duplicated input signal. The delayed first part signal is then multiplied by the step factor $\alpha'_i(n)$ and by the difference (e). The value of $a'_i(n)$ is then added to the signal, resulting in $a'_i(n+1)$.

Figure 6:
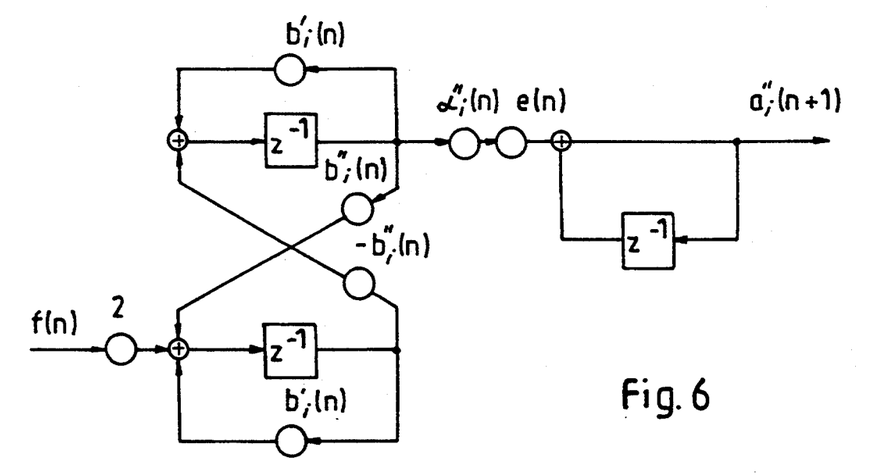
FIG. 6 shows a second adapting circuit diagram

Turning next to FIG. 6, two additional intermediate signals are added resulting in a first part signal. The signal f(n) is duplicated, and two additional intermediate signals are added resulting in a second part signal. Two additional intermediate signals are also added to the duplicated input signal resulting in a second pan signal. Both the first and second pan signals are then delayed by one unit of time. The delayed first part signal will be processed further, and is also used for the formation of two intermediate signals. The delayed first part signal is multiplied by a factor $b'_i(n)$ and then used as a first intermediate signal for forming the first part signal. The delayed first pan signal is also multiplied by a factor $b''_i(n)$ and then added as a third intermediate signal to duplicated input signal (f). The delayed second part signal is used exclusively for the formation of two additional intermediate signals. The delayed second pan signal is multiplied by a factor $b'_i(n)$ and then added as a fourth intermediate signal to the duplicating input signal. The delayed second part signal is also multiplied by a factor $-b''_i(n)$ and then used as a second intermediate signal for forming the first part signal. The delayed first part signal is then multiplied by a step factor $\alpha''_i(n)$, and by the difference (e). The value of $a''_i(n)$ is then added to the signal to be processed further, resulting in $a''_i(n+1)$.

Figure 7:
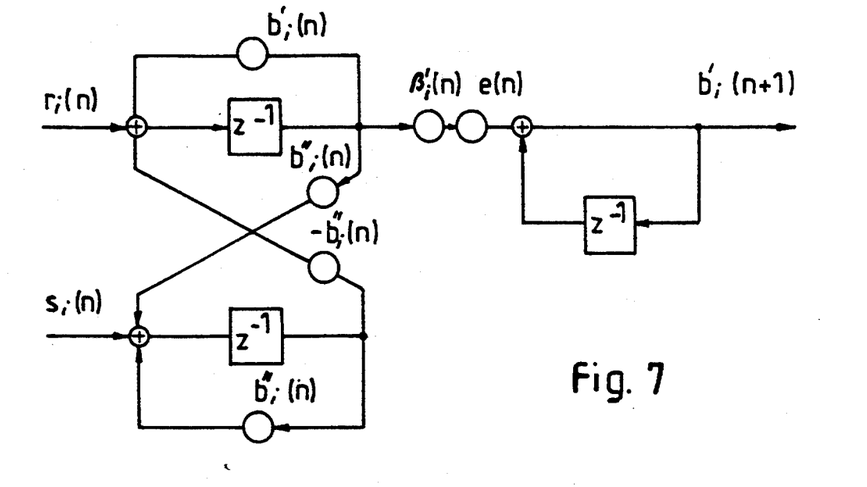
FIG. 7 shows a third adapting circuit diagram

Referring now to FIG. 7, two intermediate signals are added to output signal $r_i(n)$ of the signal flow, resulting in a first part signal. Two additional intermediate signals are added to output signal $s_i(n)$ of the signal flow, resulting in a second part signal. Both the first and second part signals are then delayed by one unit of time. The delayed first part signal will be processed further, and is used for the formation of two intermediate signals. The delayed first part signal is multiplied by a factor $b'_i(n)$ and then added as a first intermediate signal to the input signal $r_i(n)$. The delayed first part signal is also multiplied by a factor $b''_i(n)$ and then added as a third intermediate signal to the input signal $s_i(n)$. The delayed second part signal is used exclusively for the formation of two additional intermediate signals. The delayed second part signal is multiplied by a factor $b'_i(n)$ and then added as a fourth intermediate signal to the input signal $s_i(n)$. The delayed second part signal is also multiplied by a factor $-b''_i(n)$ then added as a second intermediate signal to the input signal $r_i(n)$. The delayed first part signal is multiplied by a factor $\beta'_i(n)$ and by the difference (e). The value of $-b''_i(n)$ is then added to the delayed first part signal, resulting in $b'_i(n+1)$.

Figure 8:
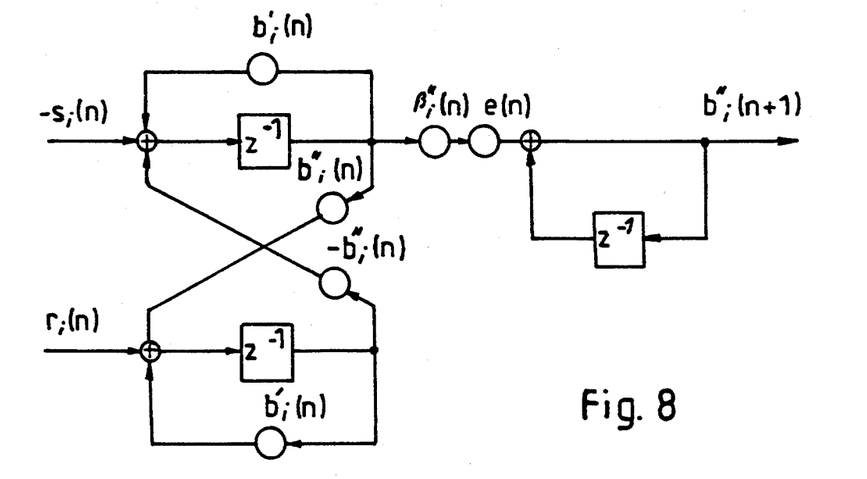
FIG. 8 shows a fourth adapting circuit diagram

Lastly, turning now to FIG. 8, two intermediate signals are added to the output signal $-s_i(n)$ of the signal flow resulting in a first part signal. Two additional intermediate signals are added to output signal $r_i(n)$ of the signal flow, resulting in a second part signal. Both the first and second part signals are then delayed by one unit at a time. The delayed first part signal is used for the formation of the two intermediate signals. The delayed first part signal is multiplied by a factor $b'_i(n)$, and then added as a first intermediate signal to the input signal $-s_i(n)$. The delayed first part signal is also multiplied by a factor $b''_i(n)$, and then added as a third intermediate signal to the input signal $r_i(n)$. The delayed second part signal is used exclusively for the formation of two additional intermediate signals. The delayed second part signal is multiplied by a factor $b'_i(n)$ and then added as a fourth intermediate signal to input signal $r_i(n)$. The delayed second part signal is multiplied by the factor $b''_i(n)$ and then added as a second intermediate signal to the input signal $-s_i(n)$. The delayed first part signal, which will be processed further, is then multiplied by the step factor $\beta''_i(n)$ and by the difference $e(n)$. The value of $b''_i(n)$ is added to the signal to be processed further, resulting in $b''_i(n+1)$.

Thus the signal flows for each degree of freedom i, as disclosed in FIG. 4, are arranged in parallel and superimposed to form a model response y(n), as illustrated in FIG. 9. A difference e(n) is then measured at the point in time 'n' between the model response y(n) and the system response d(n), the system response having been time delayed by one unit of time. The model parameters for the system at the point in time (n+1), generated as shown in FIGS. 5, 6, 7, and 8 are then used to adapt the model parameters to system 1. Also, and as illustrated in FIGS. 5, 6, 7, and 8, each of the model parameters has a variable step sized coefficient $\alpha'_i(n), \alpha''_i(n), \beta'_i(n), \& \beta''_i(n)$, respectively, used for determining the accuracy of the adaptation of the model to system 1.

The number of signal flows for the method of determining the dynamic characteristic quantities in a linear system is chosen to be greater than the maximum number of degrees of freedom 'i' of system 1.

Figure 10:
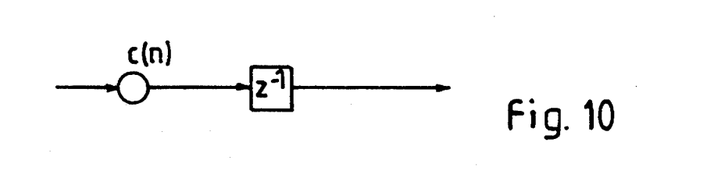
FIG. 10 shows a circuit diagram for the parallel auxiliary signal flow
Figure 11:
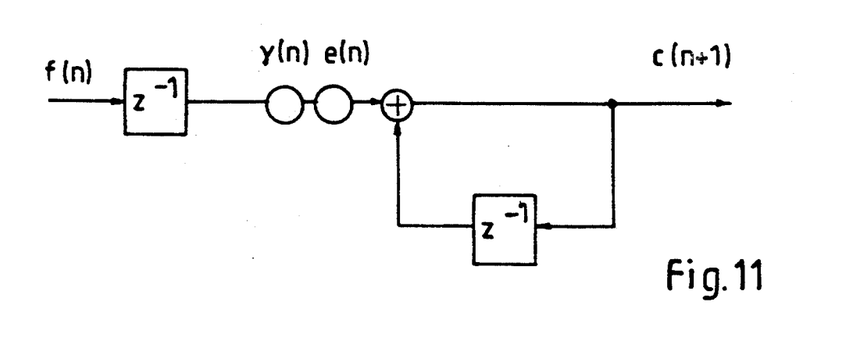
FIG. 11 shows a circuit diagram for parameter 'c' resulting from signal (f) being delayed by one unit of time

The model also includes a parallel auxiliary signal flow, FIG. 10, which results from the multiplication of the input signal (f) by a factor (c) delayed by one unit of time, resulting in an output signal. The parameter 'c' results from delaying the signal (f) by one unit of time, FIG. 11, and multiplying the delayed input signal by the factor $\gamma_i(n)$ and by the difference (e), described above. The value of c(n) is then added thereto, resulting in c(n+1).

In detail, the execution of the method begins with the excitation of the system I to be identified and the model 2 using signal 'f', whereby broadband white noise is preferably employed. The time-delayed system response 'd' is now measured and allocated to time 'n'. At the same time, the determination of the model response 'y' is carried out at time 'n'. To do this initial values have to be established for parameter 'c' and model parameters $a'_i, a''_i, b'_i,$ and $b''_i$ at the beginning. The number of signal flows VI, has to selected to match the system 1 to be identified, whereby, however, the number of signal flows VI may exceed the number 'm' of degrees of freedom of system 1 without any disadvantageous consequences. After determining difference 'e' the parameters and the model parameters can now be updated, i.e. adapted to system 1 in a first step; the precision, but also the velocity here depends on the step size coefficients $\gamma(n), \alpha'_i(n), \alpha''_i(n), \beta'_i(n), \beta\Delta_i(n)$. Therefore, it may be advisable to specify the coefficients for the acceleration of the adaptation larger at the start and thereafter smaller in order to improve the precision. The more accurate the respective inherent value is, the smaller the corresponding step size coefficients must be in order to achieve a useful adaptation of the model to the system. After updating the model parameters, measurement of the system response, determination of the model response and calculation of the updated model parameters for the following point in time n+1 are all repeated. Taking as a basis a velocity or a path as system response, parameter 'c', for the auxiliary signal flow is to be held at zero. For this, c(l)=0 and $\gamma=0$ can be chosen. A large degree of adaptadon of the model 2 to the system 1 can be achieved even after a limited number of time intervals. That this may be performed at a very high velocity can be put down to the fact that the operations are all of a simple kind. The natural frequency $f_i$ and the damping quantity according to Lehr $\delta$ of the 'ith' degree of freedom can be calculated from the adapted model parameters $b'_i$ and $b''_i$:

$$f_i = \frac{1}{2\pi\tau} \sqrt{\frac{1}{4} \ln^2(b'^2_i + b''^2_i) + \arctan^2\left(\frac{b''_i}{b'_i}\right)}$$

$$\delta_i = -\frac{\ln(b'^2_i + b''^2_i)}{2\sqrt{\frac{1}{4}\ln^2(b'^2_i + b''^2_i) + \arctan^2\left(\frac{b''_i}{b_i}\right)}}$$

Figure 2:
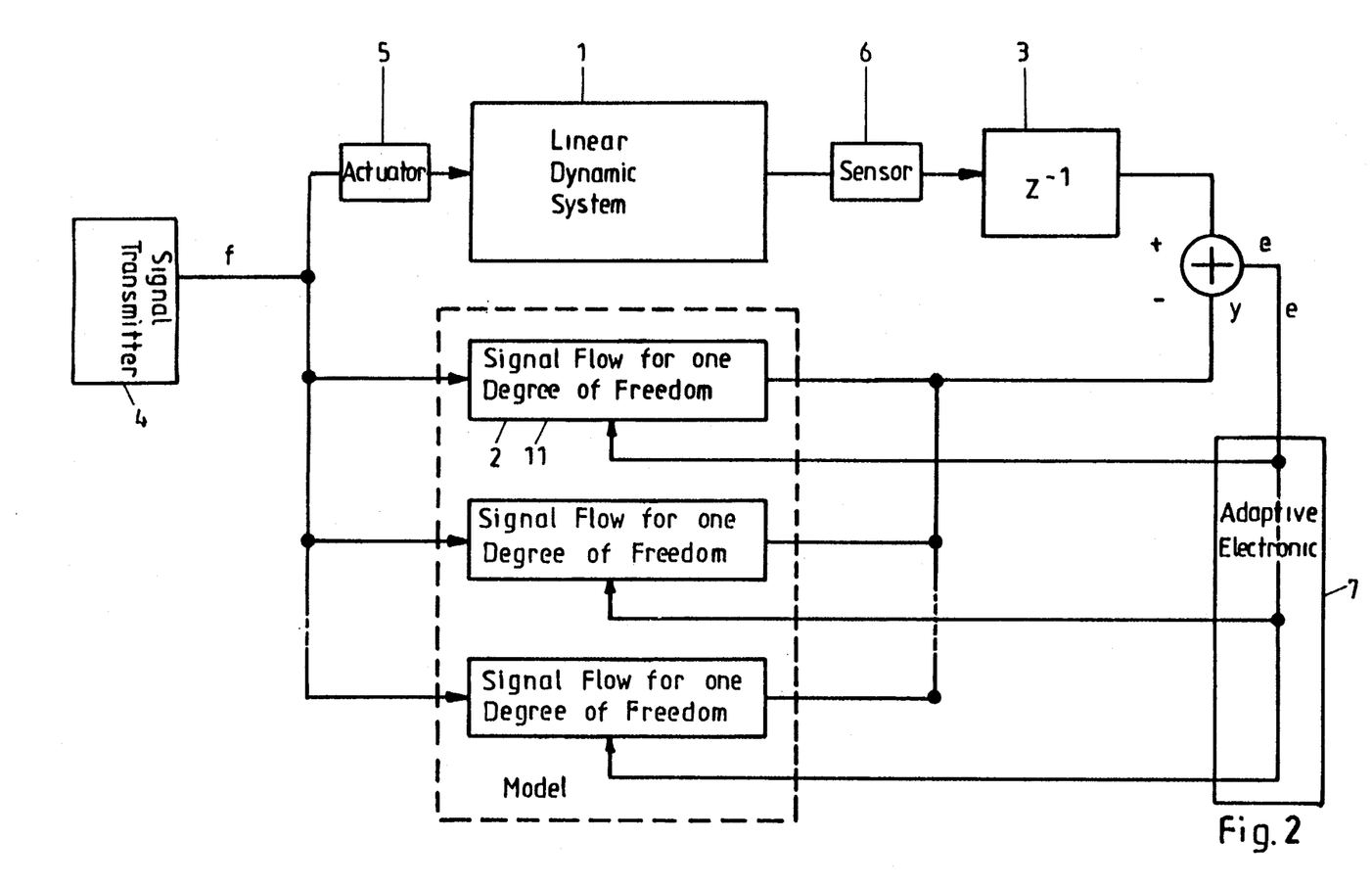
FIG. 2 shows a first embodiment example of the facility for executing the method.

In the version of the facility for executing the method illustrated in FIG. 2, a signal transmitter 4 is provided for signal 'f'. An actuator 5 transmits the signal 'f' to system 1. The actuator can, for example, be constructed as a shaker. The system response 'd' is picked up from system 1 by a sensor 6 and delayed by the time delay device 3. An electronic filter 11 serves as a model 2 for the system 1. An adaptive electronic 7 is provided to adapt the model parameters of the filter 11. The difference 'e' between the system response 'd' and the model response 'y' serves as input value for the adaptive electronic 7. The velocity of the adaptation through the electronic 7 depends on the coefficients $\gamma(n), \alpha'_i(n), \alpha''_i(n), \beta'_i(n), \beta''_i(n)$. The step size coefficients take on a real physical significance insofar as that for acquiring an inherent value with a certain accuracy, a maximum step size must be maintained. Therefore, the step size coefficients correspond to a filtering width for the accuracy of the inherent values. The linear dynamic system 1 of the version of the facility for executing the method according to FIG. 2 could be a mechanical dynamic system with which it is necessary to find an optimum operating point. This is possible with real-time control by means of the model parameters and the dynamic characteristic quantities which can be determined from this.

Figure 3:
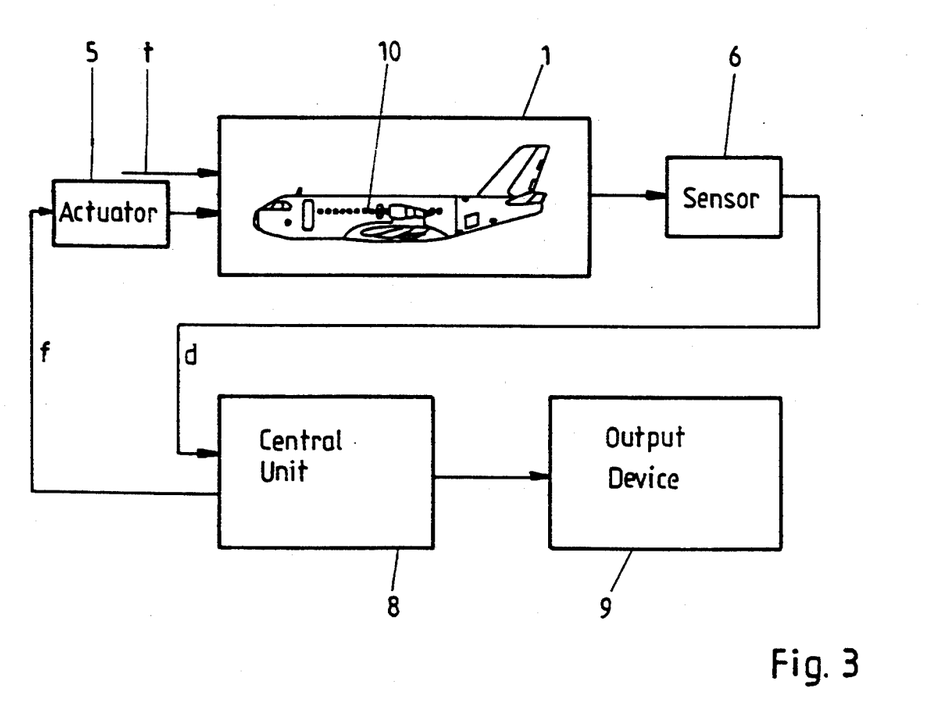
FIG. 3 shows a second embodiment example of the facility for executing the method.

In the version of the facility for executing the method illustrated in FIG. 3, a central unit 8 is provided in which the signal transmitter 4, the time delay device 3, the adaptive electronic 7, and also the filter 11 are all integrated. Similarly, the difference between the system response 'd' and the model response 'y' is also carried out in the central unit 8. The dynamic system 1 is an aircraft 10, which, during flight, is excited by both signal 'f' and through external disturbance 't'. Accordingly, only the part of the system response 'd' which correlates with signal 'f' has to be taken into account. This does not, of course, apply for the affects of the external disturbance. In order to minimize the additional loadings of the aircraft 10, excitation of the system I by signal 'f' can be limited to short, recurrent time intervals. Depending on the alterations to the dynamic characteristic quantities of the aircraft, the central unit 8 specifies on an output device 9 whether a critical change in the characteristic quantities is present. Such a critical change in the characteristic quantities could, for example, be observed with crack formation in a supporting load bearing member of the aircraft. Therefore, the method is suitable for early detection of failures.

While the foregoing describes preferred embodiments of the invention, it will be understood by those skilled in the art that variations and modifications thereof can be made without departing from the spirit and scope of the invention as described by the following claims.

I claim:

1. A method for identifying the dynamic characteristic quantities of a linear system, comprising the steps of:
    a) exciting the system with a signal 'f';
    b) measuring a system response 'd' against said signal 'f';
    c) delaying said measured system response 'd' by one unit of time;
    d) establishing sets of four model parameters $a'_i$, $a''_i$, $b'_i$ and $b''_i$ for each degree of freedom of the system;
    e) generating a model response from an electronic model for the system in response to said signal 'f' using said sets of model parameters, wherein the model response has a signal flow for each degree of freedom 'i' of the system, and wherein said signal flows are arranged parallel to one another;
    f) wherein the step of generating the model response for each degree of freedom 'i' further comprises the steps of:
        duplicating the signal 'f',
        splitting the duplicated signal into a first and a second part signal, respectively,
        multiplying the first part signal by the factor $a'_i(n)$,
        multiplying the second part signal by the factor $a''_i(n)$,
        adding a first intermediate signal and a second intermediate signal to said multiplied first part signal,
        adding a third intermediate signal and a fourth intermediate signal to said multiplied second part signal, delaying the resulting sum of each of said part signals and intermediate signals by one unit of time, transmitting the delayed sum of said first part signal and said first and second intermediate signals as an output signal $r_i(n)$, multiplying the output signal $r_i(n)$ by the factor $b'_i(n)$ to generate the first intermediate signal to be added to said first part signal; multiplying the output signal $r_i(n)$ by the factor $b''_i(n)$ to generate the third intermediate signal to be added to said second part signal, transmitting the delayed sum of said second part signal and said third intermediate signal and fourth intermediate signal as an output signal $s_i(n)$, multiplying the output signal $s_i(n)$ by the factor $b'_i(n)$ to generate the fourth intermediate signal to be added to said second part signal, and multiplying the output signal $s_i(n)$ by the factor $-b''_i(n)$ to generate the second intermediate signal to be added to said first part signal;
    g) and wherein the step of generating the model response further comprises the step of superimposing said output signal $r_i(n)$ of each of said individual signal flows for each degree of freedom 'i' for forming the model response $y(n)$;
    h) then determining a difference $e(n)$ between said model response $y(n)$ and said delayed system response at a point in time 'n'; and
    i) adapting said model parameters to the system for a point in time $(n+1)$ in response to said difference;
    whereby the dynamic characteristic quantities of the system are compared to and measured against the model response for determining the characteristic quantities of the system.

2. The method of claim 1, wherein step i) of adapting said model parameters to the system for a point in time $(n+1)$ further comprises the steps of:

j) determining the accuracy of adapting said model parameters to the system at a point in time $(n+1)$ with one each of variable step coefficients $\alpha'_i(n)$, $\alpha''_i(n)$, $\beta'_i(n)$ and $\beta''_i(n)$ for each of said model parameters, respectively;
    k) duplicating the signal $f(n)$, adding a first intermediate signal and second intermediate signal to the duplicated signal resulting in a first part signal, adding a third intermediate signal to a fourth intermediate signal resulting in a second part signal, delaying both of said part signals by one unit of time, multiplying said delayed first part signal by a factor $b'_i(n)$ to generate the first intermediate signal to be added to said duplicated input signal, multiplying said delayed first part signal by a factor $b''_i(n)$ to generate the third intermediate signal to be added to said fourth intermediate signal, multiplying said delayed second part signal by a factor $b'_i(n)$ to generate the fourth intermediate signal to be added to said third intermediate signal, multiplying said delayed second part signal by a factor $-b''_i(n)$ to generate the second intermediate signal to be added to said duplicated input signal, multiplying said delayed first part signal by the variable step coefficient $\alpha'_i(n)$ and by said difference $e(n)$, and adding the value of $a'_i(n)$ to said signal resulting in a signal $a'_i(n+1)$ for use as model parameter at the point in time $(n+1)$;
    l) adding a first intermediate signal to a second intermediate signal, resulting in a first part signal:
        duplicating the signal f(n),
        adding a third intermediate signal and a fourth intermediate signal to the duplicated signal resulting in a second part signal,
        delaying both of said part signals by one unit of time,
        multiplying said delayed first part signal by a factor $b'_i(n)$ to generate the first intermediate signal to be added to said duplicated input signal,
        multiplying said delayed first part signal by a factor $b''_i(n)$ to generate the third intermediate signal to be added to said fourth intermediate signal,
        multiplying said delayed second part signal by a factor $b'_i(n)$ to generate the fourth intermediate signal to be added to said third intermediate signal,
        multiplying said delayed second part signal by a factor $-b''_i(n)$ to generate the second intermediate signal to be added to said duplicated input signal,
        multiplying said delayed first part signal by the variable step coefficient $\alpha''_i(n)$ and by said difference $e(n)$, and
        adding the value of $a''_i(n)$ to said signal resulting in a signal $a''_i(n+1)$ for use as model parameter at the point in time $(n+1)$;
    m) adding a first intermediate signal and a second intermediate signal to said output signal $r_i(n)$ of said signal flow resulting in a first part signal,
        adding a third intermediate signal and a fourth intermediate signal to said output signal $s_i(n)$ of said signal flow resulting in a second part signal, delaying both of said part signals by one unit of time,
        multiplying said delayed first part signal by a factor $b'_i(n)$ to generate the first intermediate signal to be added to said duplicated input signal, multiplying said delayed first part signal by a factor $b''_i(n)$ to generate the third intermediate signal to be added to said fourth intermediate signal, multiplying said delayed second part signal by a factor $b'_i(n)$ to generate the fourth intermediate signal to be added to said third intermediate signal, multiplying said delayed second part signal by a factor $-b''_i(n)$ to generate the second intermediate signal to be added to said duplicated input signal, multiplying said delayed first part signal by the variable step coefficient $\beta'_i(n)$ and by said difference $e(n)$, and adding the value of $b'_i(n)$ to said signal resulting in a signal $b'_i(n+1)$ for use as model parameter at the point in time $(n+1)$; and n) adding a first intermediate signal and a second intermediate signal to said output signal $-s_i(n)$ of said signal flow resulting in a first part signal, adding a third intermediate signal and a fourth intermediate signal to said output signal $r_i(n)$ of said signal flow resulting in a second part signal, delaying both of said part signals by one unit of time, multiplying said delayed first part signal by a factor $b'_i(n)$ to generate the first intermediate signal to be added to said duplicated input signal, multiplying said delayed first part signal by a factor $b''_i(n)$ to generate the third intermediate signal to be added to said fourth intermediate signal, multiplying said delayed second part signal by a factor $b'_i(n)$ to generate the fourth intermediate signal to be added to said third intermediate signal, multiplying said delayed second part signal by a factor $-b''_i(n)$ to generate the second intermediate signal to be added to said duplicated input signal, multiplying said delayed first part signal by the variable step coefficient $\beta''_i(n)$ and by said difference $e(n)$, and adding the value of $b''_i(n)$ to said signal resulting in a signal $b''_i(n+1)$ for use as model parameter at the point in time $(n+1)$.

3. The method of claim 1, further comprising the step of selecting a number of signal flows greater than the maximum number of degrees of freedom of the system.

4. The method of claim 1, further comprising the steps of:

generating an auxiliary signal by multiplying said input signal $f(n)$ by a model parameter $c(n)$ and by delaying this multiplied signal by one unit of time;

superimposing the auxiliary signal with the sum of the output signals $r_i(n)$ of each signal flow, resulting in the model response $y(n)$; and adapting the parameter c of the model to the system, wherein said step further comprises the steps of delaying the signal $f(n)$ by one unit of time, multiplying the delayed signal by an accuracy determining factor $\tau_i(n)$ and by said difference $e(n)$, and then adding the value of $c(n)$ thereto, resulting in a signal $c(n+1)$ for use as the model parameter at the point in time $(n+1)$.

5. The method of claim 1, further comprising the steps of exciting the system with the signal f by an actuator, and receiving the system response d with a sensor.

6. The method of claim 1, further comprising the steps of detecting failures in the system by detecting changes in the dynamic characteristic quantities of the system in response thereto.

7. The method of claim 6, further comprising the steps of using said model for early detection of failures in oscillating dynamic systems, such as aircraft, and exciting the system with a signal 'f' in addition to the signal 'f' created by the system oscillations.

8. The method of claim 1, further comprising the step of using a broadband white noise as signal 'f'.

* * * * *